US009333750B2

(12) United States Patent
Kato

(10) Patent No.: US 9,333,750 B2
(45) Date of Patent: May 10, 2016

(54) METHOD OF PROCESSING SUBSTRATE

(71) Applicant: CANON KABUSHIKI KAISHA, Tokyo (JP)

(72) Inventor: Masataka Kato, Hiratsuka (JP)

(73) Assignee: Canon Kabushiki Kaisha, Tokyo (JP)

(*) Notice: Subject to any disclaimer, the term of this patent is extended or adjusted under 35 U.S.C. 154(b) by 39 days.

(21) Appl. No.: 14/256,743

(22) Filed: Apr. 18, 2014

(65) Prior Publication Data

US 2014/0315335 A1 Oct. 23, 2014

(30) Foreign Application Priority Data

Apr. 23, 2013 (JP) ................................ 2013-090807

(51) Int. Cl.
*H01L 21/00* (2006.01)
*B41J 2/16* (2006.01)

(52) U.S. Cl.
CPC .............. *B41J 2/1603* (2013.01); *B41J 2/1628* (2013.01); *B41J 2/1629* (2013.01); *B41J 2/1631* (2013.01); *B41J 2/1635* (2013.01); *B41J 2/1645* (2013.01)

(58) Field of Classification Search
CPC ........ H01L 21/304; B41J 2/1607; B41J 2/162
USPC ....................................... 438/21, 704; 216/27
See application file for complete search history.

(56) References Cited

U.S. PATENT DOCUMENTS

| | | | | |
|---|---|---|---|---|
| 5,697,144 | A * | 12/1997 | Mitani et al. | 29/611 |
| 6,375,858 | B1 * | 4/2002 | Makigaki et al. | 216/27 |
| 2007/0182777 | A1 * | 8/2007 | Vaeth et al. | 347/20 |
| 2007/0278181 | A1 * | 12/2007 | Tsuboi et al. | 216/58 |
| 2009/0123385 | A1 * | 5/2009 | Bohmer et al. | 424/9.52 |
| 2010/0252528 | A1 * | 10/2010 | Kataoka et al. | 216/27 |
| 2011/0018938 | A1 * | 1/2011 | Rivas et al. | 347/45 |

FOREIGN PATENT DOCUMENTS

JP 2003-053979 A 2/2003

* cited by examiner

*Primary Examiner* — Caridad Everhart
(74) *Attorney, Agent, or Firm* — Canon U.S.A., Inc. IP Division

(57) ABSTRACT

A method of processing a substrate includes forming holes in bottom portions of a plurality of recesses formed in a substrate to be arranged in an array direction at a predetermined pitch by performing reactive ion etching on the bottom portions of the plurality of recesses. The forming holes in the bottom portions of the plurality of recesses is a process of preparing a substrate in which a dummy recess serving as a dummy is formed on at least one side of the array direction, in which the plurality of recesses that include the bottom portions in which the holes are formed are arranged, such that a recess is formed on both sides of a recess so that the plurality of recesses are formed at the predetermined pitch in the array direction and performing reactive ion etching on the bottom portions of the plurality of recesses of the prepared substrate.

17 Claims, 8 Drawing Sheets

METHOD OF PROCESSING SUBSTRATE

BACKGROUND OF THE INVENTION

1. Field of the Invention

The present invention relates to a method of processing a substrate.

2. Description of the Related Art

An example of a technology for forming a hole or the like in a substrate is reactive ion etching (RIE), which is a type of dry etching. Reactive ion etching is a method of forming a predetermined shape in a substrate by etching a surface, which is to be processed, of the substrate by using a reaction gas that has been turned into plasma as a result of being introduced into a processing chamber. More specifically, a substrate is fixed to a lower electrode in a processing chamber by using, for example, an electrostatic chuck, and a reaction gas is supplied to an area between the lower electrode and an upper electrode, to which a high-frequency power source is connected, from micropores of the upper electrode. As a result, the reaction gas, which has been supplied, is turned into plasma in the area between the upper electrode and the lower electrode, and the substrate is etched, so that a predetermined shape is formed in the substrate.

A technology for forming a hole in a substrate by performing reactive ion etching on the substrate is described in Japanese Patent Laid-Open No. 2003-053979.

SUMMARY OF THE INVENTION

The present disclosure provides a method of processing a substrate including forming a hole in a bottom portion of each of a plurality of recesses that are formed in a substrate to be arranged in an array direction and spaced apart from each other by a predetermined distance by performing reactive ion etching on the bottom portion of each of the plurality of recesses, and the forming the hole in the bottom portion of each of the plurality of recesses is a process of preparing a substrate in which a dummy recess that serves as a dummy is formed on at least one side of the array direction in which the plurality of recesses, each of which includes the bottom portion in which the hole is formed, are arranged in such a manner that a recess is formed on both sides of a recess so that the plurality of recesses are spaced apart from one another by the predetermined distance in the array direction in which the plurality of recesses, each of which includes the bottom portion in which the hole is formed, are arranged and performing reactive ion etching on the bottom portion of each of the plurality of recesses of the substrate, which is prepared.

Further features of the present invention will become apparent from the following description of exemplary embodiments with reference to the attached drawings.

DESCRIPTION OF THE EMBODIMENTS

Figure 1A:
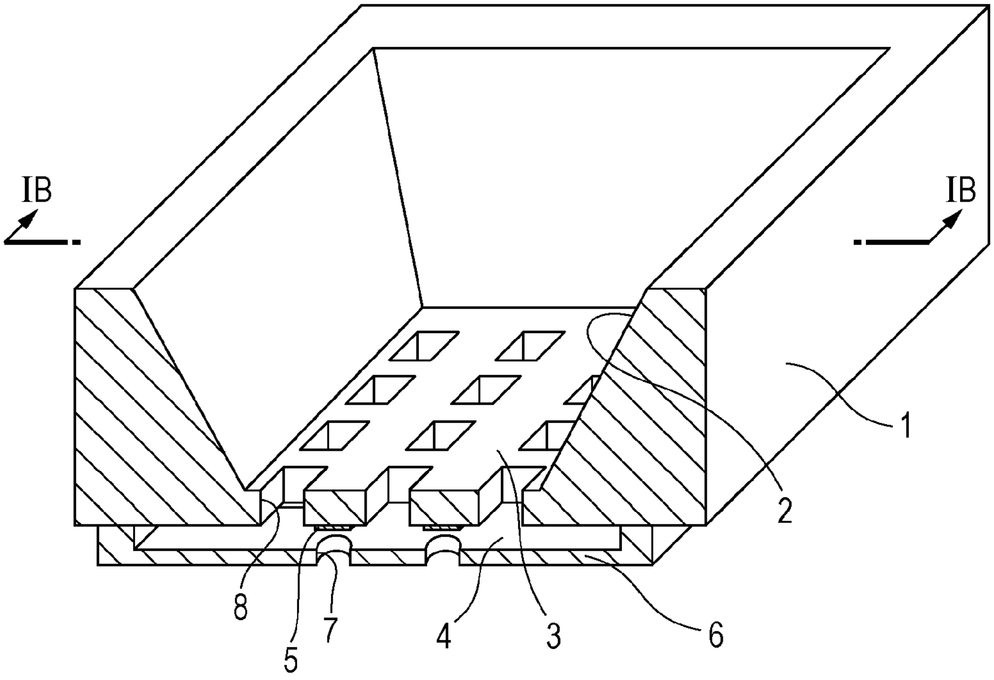
FIG. 1A is a perspective view of a liquid discharge head.

In a reactive ion etching operation, when plasma and a substrate or the like come into contact with each other, a space-charge layer that is called a sheath is formed on an interface between the substrate or the like and the plasma. Positive ions in the plasma are accelerated substantially perpendicularly to the sheath, which has been formed, and are incident on the substrate.

In the case where a surface, which is to be processed, of a substrate is flat, a sheath is formed substantially flat so as to follow the surface, which is to be processed, of the substrate. However, in the case where a recess is formed in a surface, which is to be processed, of a substrate, a sheath is formed in such a manner as to be deformed due to the influence of the recess. Therefore, positive ions will be incident on the substrate not perpendicularly to the substrate but in such a manner as to be inclined with respect to the substrate. In other words, a direction in which an etching operation is performed is inclined with respect to the surface, which is to be processed. This phenomenon is called "a tilt".

There is a case where reactive ion etching such as that described in Japanese Patent Laid-Open No. 2003-053979 is performed on bottom portions of recesses, which are formed in a substrate in such a manner as to be arranged in an array direction and spaced apart from one another by a predetermined distance, so as to form holes in the bottom portions of the recesses. Such a reactive ion etching operation is performed in the case where, for example, a substrate is a substrate of a liquid discharge head, and where common flow paths and individual flow paths that are flow paths for liquid are formed in the substrate. The recesses that are to be formed in the substrate serve as the common flow paths, and the holes that are to be formed in bottom portions of the recesses serve as the individual flow paths. In this case, since the recesses are formed in a surface, which is to be processed, of the substrate, there is a case where a tilt occurs as described above, and the individual flow paths (the holes) that are formed in the bottom portions of the recesses are inclined with respect to the bottom portions.

In particular, in the studies that were conducted by the inventors of the present invention, it was found that in the case where reactive ion etching was performed on a bottom portion of a recess on both sides of which a recess was not formed in such a manner as to be spaced apart from the recess by a predetermined distance, a hole that was formed in the bottom portion of the recess was likely to be deformed. It was discovered that in the case where, for example, a recess was formed on one side of a particular recess, and a recess was not formed on the other side (the opposite side to the one side) of the particular recess in an array direction, a hole that was formed in a bottom portion of the particular recess was likely to incline toward the side on which a recess was not formed.

Accordingly, the present invention provides a method of processing a substrate, the method enabling, when holes are formed in bottom portions of recesses that are formed in a substrate in such a manner as to be arranged in an array direction and spaced apart from one another by a predetermined distance, the holes to be resistant to deformation.

An embodiment of the present invention will be described below. In the following embodiment, the case of processing a substrate of a liquid discharge head will be described as an example.

Figure 1B:
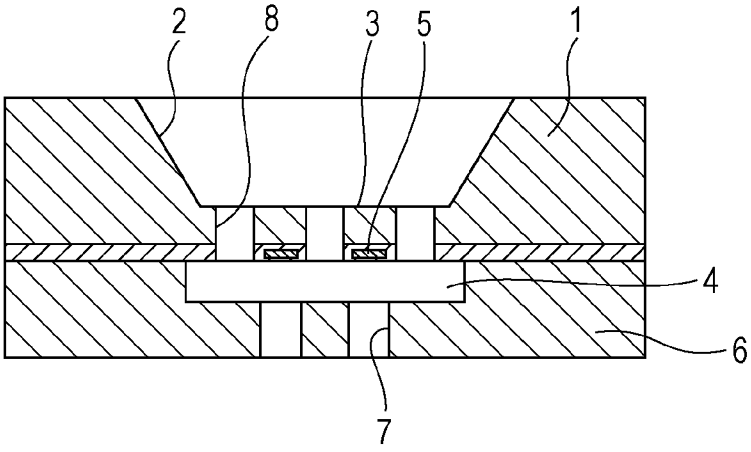
FIG. 1B is a sectional view of the liquid discharge head.

FIG. 1A is a perspective view of a liquid discharge head, and FIG. 1B is a sectional view of the liquid discharge head taken along dashed line IB-IB of FIG. 1A.

Recesses 2 are formed in a substrate 1 that is included in the liquid discharge head. The substrate 1 is a substrate of the liquid discharge head, and the recesses 2 will serve as common flow paths. The substrate 1 may be a silicon substrate made of silicon.

A discharge-port-forming member 6 is disposed on a front surface side of the substrate 1. The recesses 2 are open on a rear surface side of the substrate 1, which is the opposite side to the front surface side. Each of the recesses 2 includes a bottom portion 3 that is a portion at the bottom of the recess 2. Holes 8 that serve as individual flow paths extending from the bottom portions 3 toward the front surface side of the substrate 1 are formed in the bottom portions 3. Each of the holes 8 extends through the substrate 1 from the bottom portions 3 to the front surface side of the substrate 1.

Energy generating elements 5 are disposed on the front surface side of the substrate 1. Examples of the energy generating elements 5 include heating resistors and piezoelectric elements. Each of the energy generating elements 5 may be in contact with the front surface of the substrate 1 or may be formed in such a manner that a portion of each of the energy generating elements 5 has a hollow shape with respect to the front surface of the substrate 1.

Discharge ports 7 are formed in the discharge-port-forming member 6. In the liquid discharge head illustrated in FIGS. 1A and 1B, the discharge-port-forming member 6 serves as a flow-path-forming member. Thus, flow paths 4 for liquid are formed in the discharge-port-forming member 6. The discharge-port-forming member 6 and the flow-path-forming member may be different members. For example, the flow-path-forming member may be disposed on the substrate 1, and the discharge-port-forming member 6 may be disposed on the flow-path-forming member.

Liquid that is supplied from the recesses 2, which are formed in the substrate 1 and which serve as common flow paths, passes through the holes 8, which serve as individual flow paths, and reaches the flow paths 4 on the front surface side of the substrate 1. Then, the liquid is energized by the energy generating elements 5 in the flow paths 4, discharged from the discharge ports 7, and lands on a recording medium such as a sheet. In this manner, recording and so forth of an image is performed.

Figure 2A:
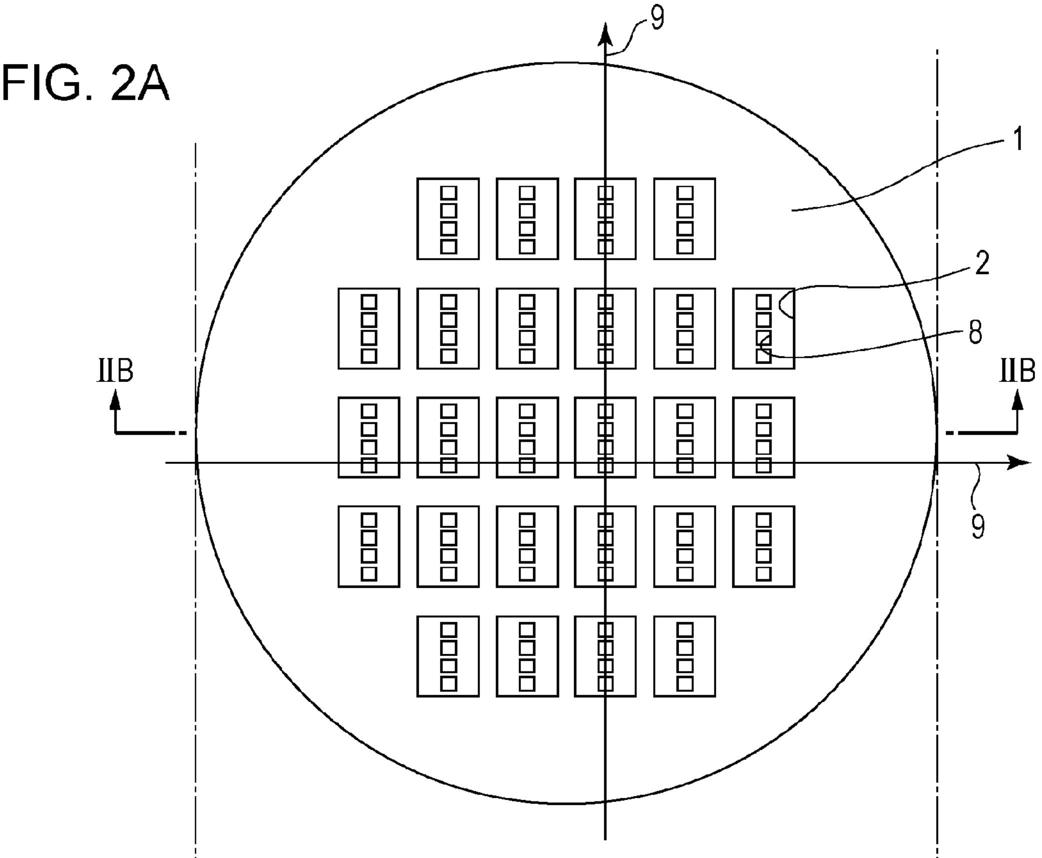
FIGS. 2A to 2C are diagrams illustrating an example of a method of processing a substrate.
Figure 2B:
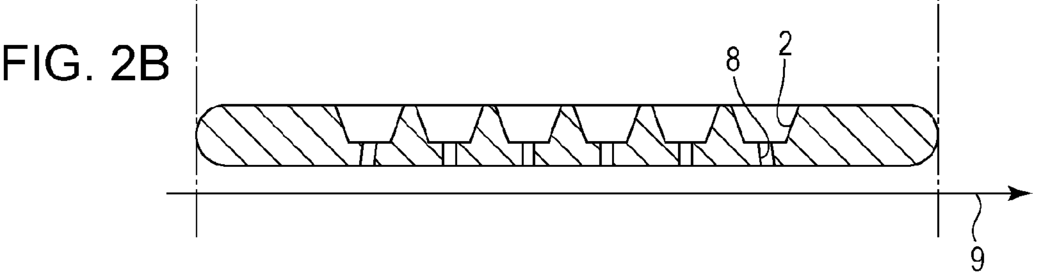

A substrate of a liquid discharge head such as that illustrated in FIGS. 1A and 1B is formed by being separated from a large substrate that is called a wafer. An example of such a wafer is illustrated in FIG. 2A. FIG. 2A is a diagram illustrating the substrate 1 before being separated from a wafer as viewed from the rear surface side of the substrate 1. FIG. 2B is a sectional view of the substrate 1 taken along dashed line IIB-IIB of FIG. 2A.

The recesses 2 are formed in the substrate 1 in such a manner as to be arranged in array directions and spaced apart from one another by a predetermined distance. The array directions are the directions in which the recesses 2 are arranged, and for example, in FIG. 2A, the directions that are indicated by arrows 9 are the array directions. The predetermined distance may be a substantially constant distance. However, the predetermined distance need not always be a substantially constant distance. In FIG. 2B, in the cross section of the substrate 1 taken along dashed line IIB-IIB of FIG. 2A, one of the holes 8, which serves as an individual flow path, is formed in each of the recesses 2, which serve as common liquid chambers. However, in the cross section of the substrate 1 taken along dashed line IIB-IIB of FIG. 2A, a plurality of the holes 8 may be formed in each of the recesses 2.

Figure 2C:
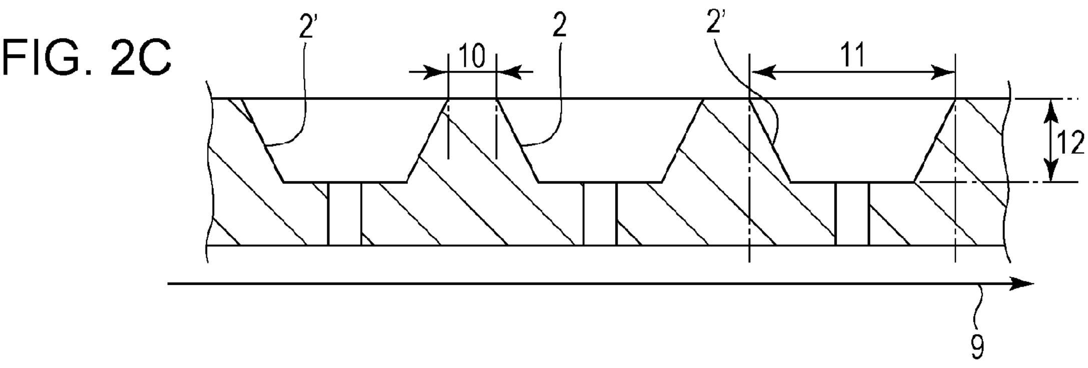

FIG. 2C is an enlarged view of the recesses 2 illustrated in FIG. 2B. Two of the recesses 2 (each of which is referred to as a recess 2' in FIG. 2C) are positioned to the sides of the other one of the recesses 2 that is illustrated in the middle of FIG. 2C in the array direction. A portion that is indicated by a reference numeral 10 corresponds to the distance between one of the recesses 2' and the other one of the recesses 2 that is adjacent to the recess 2'. In other words, the portion, which is indicated by the reference numeral 10, corresponds to the shortest distance between the openings of two of the recesses 2 on the rear surface side of the substrate 1 and corresponds to "the predetermined distance". A portion that is indicated by a reference numeral 11 corresponds to the width of each of the recesses 2 and corresponds to the width of the opening of each of the recesses 2 on the rear surface side of the substrate 1. A portion that is indicated by a reference numeral 12 corresponds to the depth of each of the recesses 2 and corresponds to the length of each of the recesses 2 in a direction perpendicular to the rear surface of the substrate 1.

Figure 3A:
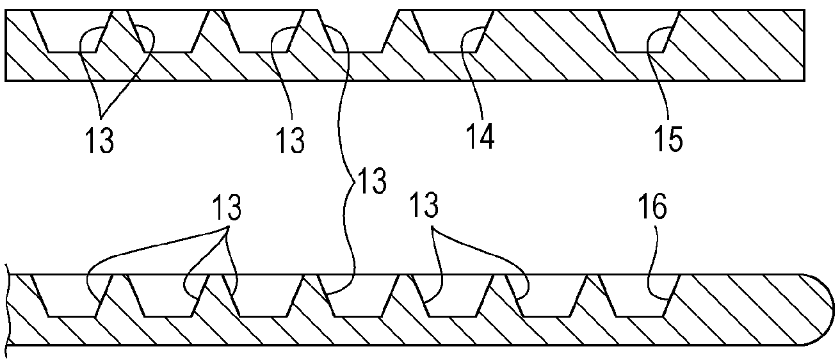
FIGS. 3A and 3B are diagrams illustrating an example of a method of processing a substrate.

A process of forming holes in bottom portions of recesses by performing reactive ion etching on the bottom portions of the recesses will now be described with reference to FIGS. 3A and 3B. FIG. 3A is a sectional view of a portion of a substrate that is similar to those illustrated in FIG. 2B and FIG. 2C and illustrates a state before the holes 8 are formed in bottom portions of recesses. The recesses are formed in the substrate in such a manner as to be arranged in an array direction and spaced apart from one another by a predetermined distance. A recess is formed on both sides of a recess in such a manner that the recesses are separated by the predetermined distance in the array direction. Each of the recesses that are formed in such a manner as to be spaced apart from one another by the predetermined distance is indicated by a reference numeral 13. On the other hand, there are some recesses that on both sides thereof do not have a recess spaced apart therefrom by the predetermined distance in the array direction. These recesses are referred to as a recess 14, a recess 15, and a recess 16. Regarding the recess 14, in FIG. 3A, a recess is formed on the left side of the recess 14 in such a manner as to be spaced apart from the recess 14 by the predetermined distance. However, another recess (the recess 15) is formed on the right side of the recess 14 in such a manner as to be spaced apart from the recess 14 by a distance larger than the predetermined distance. Regarding the recess 15, another recess (the recess 14) is formed on the left side of the recess 15 in such a manner as to be spaced apart from the recess 15 by a distance larger than the predetermined distance, and no recess is formed on the right side of the recess 15. Regarding the recess 16, a recess is formed on the left side of the recess 16 in such a manner as to be spaced apart from the recess 16 by the predetermined distance, and no recess is formed on the right side of the recess 16.

Figure 3B:
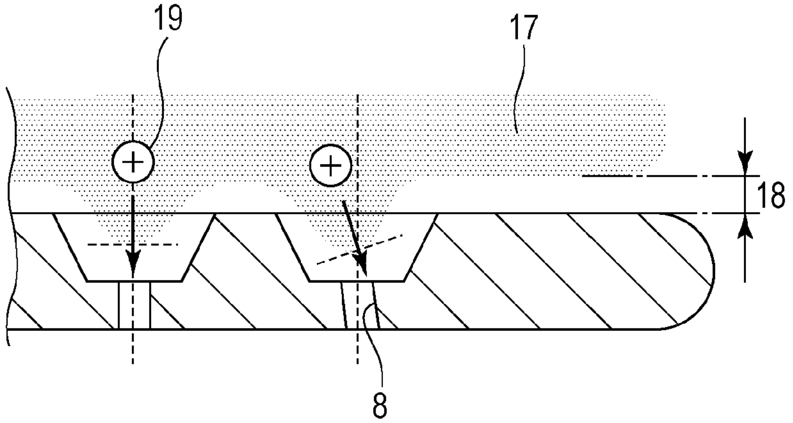

FIG. 3B illustrates a state where the holes 8 are formed in the bottom portions of the recesses by performing reactive ion etching on the bottom portions of the recesses, which are formed in the substrate. Plasma 17 and a sheath width 18 in the case of performing a reactive ion etching operation are modeled and illustrated in FIG. 3B. As illustrated in FIG. 3B, the sheath width 18 is formed in such a manner as to follow the shapes of the recesses. In this case, as illustrated on the left side in FIG. 3B, the sheath width 18 is uniformly deformed in the recesses that are formed in such a manner as to be spaced apart from one another by the predetermined distance. On the other hand, as illustrated on the right side in FIG. 3B, the sheath width 18 is unevenly deformed in the recess at least one side of which does not have a recess spaced apart therefrom by the predetermined distance. For example, there are no recesses located outside the recesses located at the opposite ends of the array direction, and thus, the sheath width 18 is unevenly deformed in this manner. Positive ions 19 in the plasma 17 move perpendicularly to the sheath. Therefore, in the case where the sheath width 18 is unevenly deformed as illustrated on the right side in FIG. 3B, the direction in which the positive ions 19 move is a diagonal direction, and as a result, the holes 8 will be formed in such a manner as to be inclined in a diagonal direction.

Figure 4A:
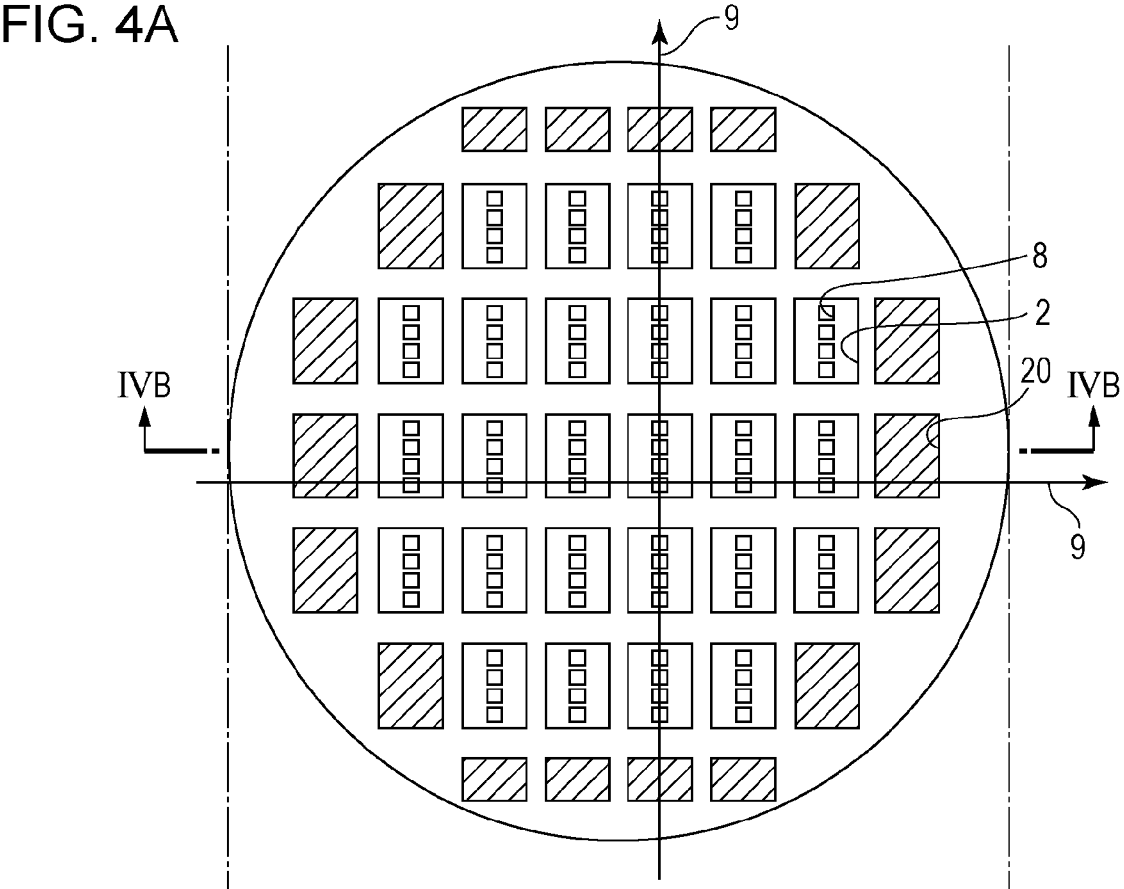
FIGS. 4A to 4C are diagrams illustrating an example of a method of processing a substrate.
Figure 4B:
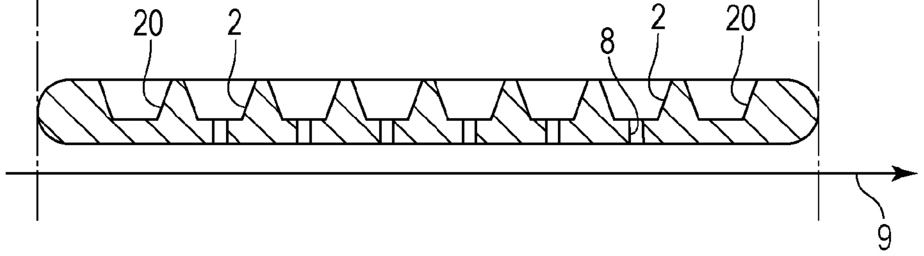

In contrast, a process of forming the holes 8 in the bottom portions of the recesses 2 by applying this invention will be described with reference to FIGS. 4A to 4C. FIG. 4A is a diagram illustrating a substrate before being separated from a wafer as viewed from a rear surface side of the substrate. FIG. 4B is a sectional view of the substrate taken along dashed line IVB-IVB of FIG. 4A.

In the present invention, recesses 20 that serve as dummies (referred to as dummy recesses 20) are formed as illustrated in FIG. 4A. The dummy recesses 20 are formed on at least one side of each of the array directions (arrows 9) in which the recesses 2, each of which includes the bottom portion in which the holes 8 are to be formed, are arranged, so that a recess is formed on both sides of the recesses 2 in such a manner as to be spaced apart from the recesses 2 by a predetermined distance in the array directions of the recesses 2, each of which includes the bottom portion in which the holes 8 are to be formed. A predetermined distance that is the distance between each of the dummy recesses 20 and one of the recesses 2, which is adjacent to the dummy recess 20 and which includes the bottom portion in which the holes 8 are to be formed, depends on the shapes and positions of the recesses 2 and the dummy recesses 20. However, the predetermined distance may be 10% or more and 190% or less of the distance between two of the recesses 2 that are adjacent to each other. The predetermined distance is preferably 50% or more and 150% or less of the distance between two of the recesses 2 that are adjacent to each other and is more preferably 90% or more and 110% or less of the distance between two of the recesses 2 that are adjacent to each other. In addition, the predetermined distance, which is the distance between each of the dummy recesses 20 and one of the recesses 2, which is adjacent to the dummy recess 20 and which includes the bottom portion in which the holes 8 are to be formed, may be substantially the same as the distance between two of the recesses 2 that are adjacent to each other.

Figure 4C:
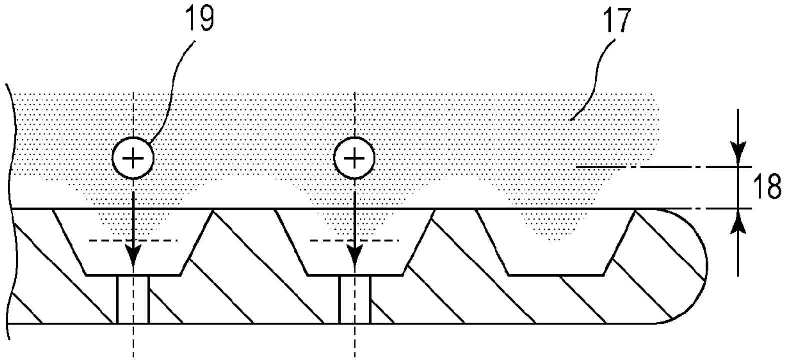

FIG. 4C illustrates a state where holes are formed in bottom portions of recesses that are formed in a substrate, which is prepared, by performing reactive ion etching on the bottom portions of the recesses of the substrate, which is prepared. Plasma 17 and a sheath width 18 in the case of performing a reactive ion etching operation are modeled and illustrated in FIG. 4C. As illustrated in FIG. 4C, the sheath width 18 is uniformly deformed in a recess on both sides of which a recess is formed so that the recesses are spaced apart from one another by a predetermined distance. In the present invention, a recess is formed on both sides of the recesses 2, each of which includes the bottom portion in which the holes 8 are to be formed, in such a manner as to be spaced apart from the recesses 2 by a predetermined distance in the array directions by forming the dummy recesses 20. This enables the sheath width 18 to be deformed as uniformly as possible, and deformation of the holes 8, which are to be formed in the bottom portions, can be suppressed.

No recess is formed outside the recesses 2 that are located at the ends in the array directions among the recesses 2, which are arranged in the array directions. Therefore, the dummy recesses 20 may be formed outside the recesses 2 that are located at the ends in the array directions among the recesses 2, which are arranged in the array directions and each of which includes the bottom portion in which the holes 8 are to be formed. In addition, as illustrated in FIG. 4A, the dummy recesses 20 may be formed in such a manner as to surround the recesses 2, which are arranged in the array directions and each of which includes the bottom portion in which the holes 8 are to be formed.

The distance (a predetermined distance) between one of the recesses 2 and one of the dummy recesses 20 that is adjacent to the recess 2 may be 3 mm or less and is preferably 1 mm or less. With this configuration, deformation of the holes 8 can be efficiently suppressed. The width of each of the dummy recesses 20 may be a width that causes a sheath to be deformed to an extent similar to the extent to which the sheath is deformed in one of the recesses 2 that is adjacent to the dummy recess 20. For example, the width of each of the dummy recesses 20 may be 10% or more of the width of one of the recesses 2 that is adjacent to the dummy recess 20. The width of each of the dummy recesses 20 is preferably 50% or more of the width of one of the recesses 2 that is adjacent to the dummy recess 20 and is more preferably 90% or more of the width of one of the recesses 2 that is adjacent to the dummy recess 20. In addition, the width of each of the dummy recesses 20 may be 120% or less of the width of one of the recesses 2 that is adjacent to the dummy recess 20 and is preferably 100% or less of the width of one of the recesses 2 that is adjacent to the dummy recess 20. The depth of each of the dummy recesses 20 may be 10% or more of the depth of one of the recesses 2 that is adjacent to the dummy recess 20. The depth of each of the dummy recesses 20 is preferably 50% or more of the depth of one of the recesses 2 that is adjacent to the dummy recess 20 and is more preferably 90% or more of the depth of one of the recesses 2 that is adjacent to the dummy recess 20. In addition, the depth of each of the dummy recesses 20 may be 120% or less of the depth of one of the recesses 2 that is adjacent to the dummy recess 20 and is preferably 100% or less of the depth of one of the recesses 2 that is adjacent to the dummy recess 20.

Figure 5A:
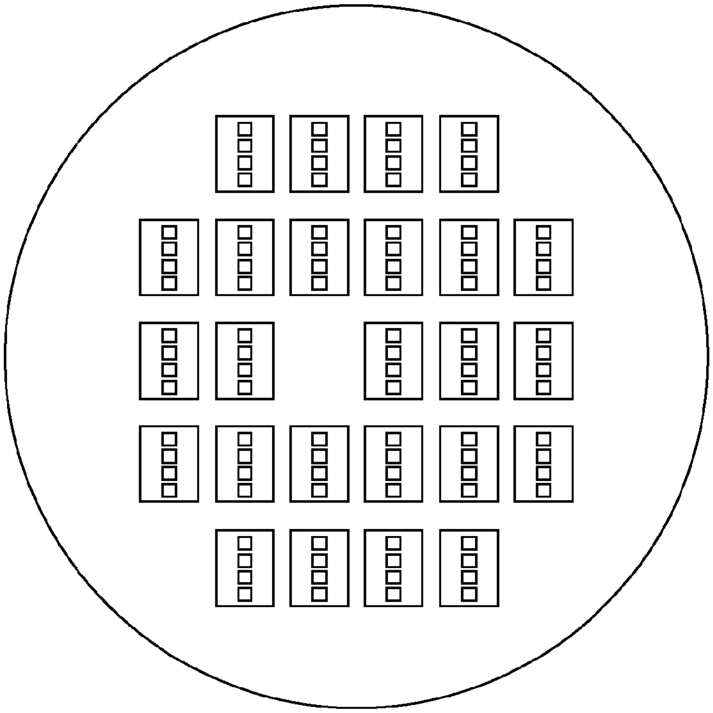
FIGS. 5A to 5C are diagrams illustrating an example of a method of processing a substrate.
Figure 5B:
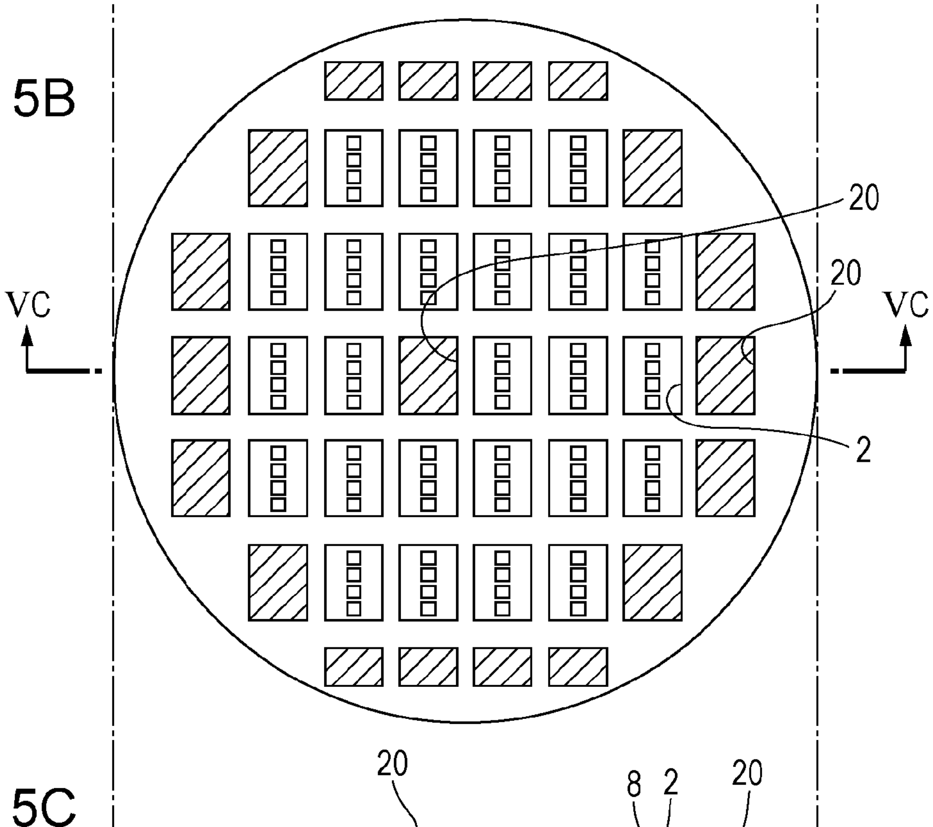
Figure 5C:
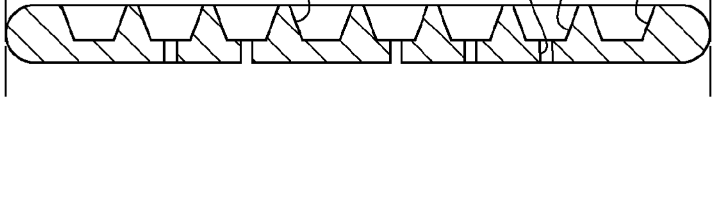

The example illustrated in FIGS. 5A to 5C will now be described. In the example, in order to form a recess on both sides of recesses in such a manner as to be spaced apart from the recesses by a predetermined distance in directions in which the recesses are arranged, dummy recesses are formed on at least one side of each of the directions in which the recesses are arranged. In this example, dummy recesses 20 are formed in a substrate illustrated in FIG. 5A. In the substrate illustrated in FIG. 5A, there is an area in which the recess 2 is not formed other than an outer peripheral portion of the substrate (a wafer). This area is utilized as, for example, an area in which a test pattern or the like is formed. In each of the recesses 2 that are adjacent to the area, in which a recess is not formed, a recess that is spaced apart from the recess 2 by a predetermined distance in the array direction is not formed on both sides of the recess 2. Therefore, in this example, as illustrated in FIG. 5B, the dummy recesses 20 are formed in the outer peripheral portion and the above-described area, in which a recess is not formed. FIG. 5C is a sectional view of the substrate taken along dashed line VC-VC of FIG. 5B. Forming the dummy recesses 20 in this manner enables a sheath width to be deformed as uniformly as possible in the recesses 2, and deformation of the holes 8 that are to be formed in the bottom portions of the recesses 2 can be suppressed.

Figure 6A:
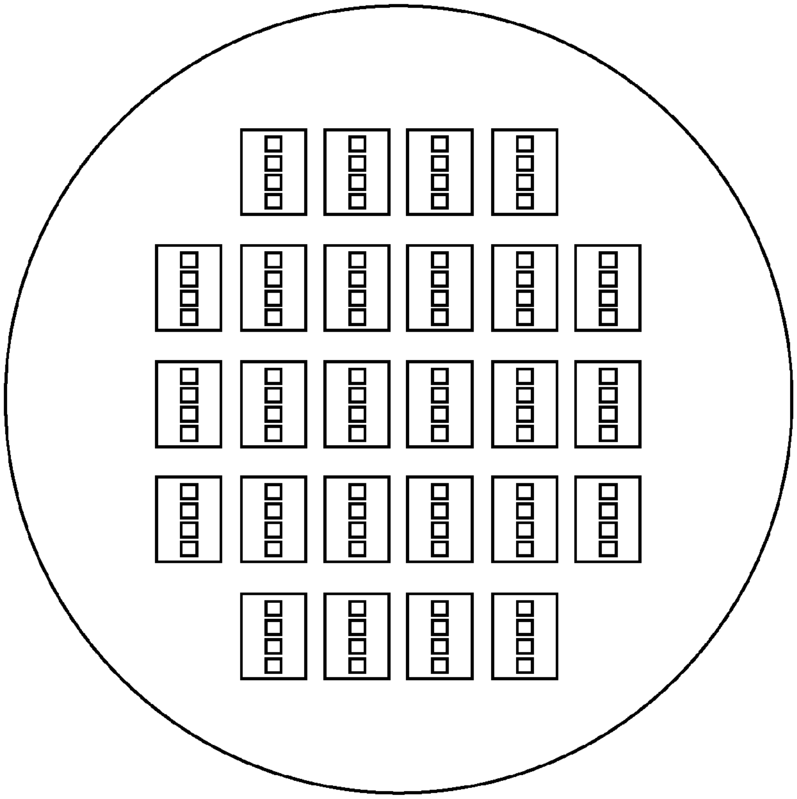
FIGS. 6A and 6B are diagrams illustrating an example of a method of processing a substrate.
Figure 6B:
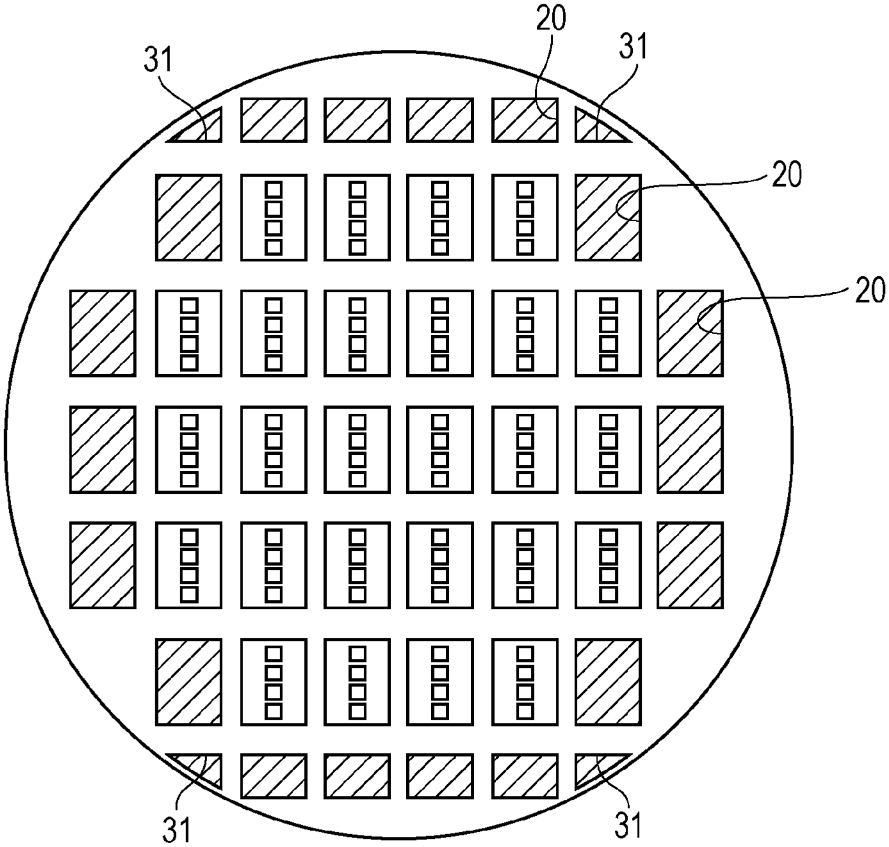

The example illustrated in FIGS. 6A and 6B will now be described. In the example, in order to form a recess on both sides of recesses in such a manner as to be spaced apart from the recesses by a predetermined distance in directions in which the recesses are arranged, dummy recesses are formed on at least one side of each of the directions in which the recesses are arranged. FIG. 6A illustrates a substrate before dummy recesses are formed therein, and FIG. 6B illustrates the substrate after dummy recesses are formed therein. As illustrated in FIG. 6B, in this example, dummy recesses 31 are formed at positions at an angle of 45 degrees with respect to the directions in which the recesses 2 are arranged. In this example, each of the dummy recesses 31 is formed on an extension line that extends in a corresponding one of the directions in which the dummy recesses 20 are arranged. In the case where the dummy recesses 31 are formed in this manner, deformation of holes that are to be formed in bottom portions of the recesses 2 can be more efficiently suppressed.

A method of manufacturing a liquid discharge head by using the method of processing a substrate according to the present invention will now be described with reference to FIGS. 7A to 7K.

Figure 7A:
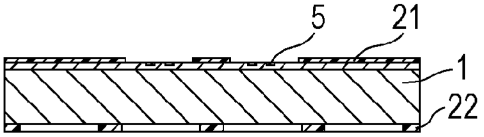
FIGS. 7A to 7K are diagrams illustrating an example of a method of manufacturing a liquid discharge head.

In the method of manufacturing a liquid discharge head, first, a substrate 1 is prepared as illustrated in FIG. 7A. The substrate 1 may be a silicon substrate that has a front surface and a rear surface, the crystal orientation of each of which is (100). Energy generating elements 5 and wiring lines (not illustrated) that drive the energy generating elements 5 are formed on the front surface side of the substrate 1. In addition, an intermediate layer 21 that is to be positioned between the substrate 1 and a discharge-port-forming member 6 in such a manner as to improve the degree of contact between the substrate 1 and the discharge-port-forming member 6 is formed on the front surface side of the substrate 1. The intermediate layer 21 is made of polyether amide or the like and is patterned by photolithography or the like. An etching mask layer 22 is formed on the rear surface side of the substrate 1. The etching mask layer 22 is made of, for example, polyether amide or the like in the same way as the intermediate layer 21. The etching mask layer 22 is patterned in such a manner as to have openings by photolithography or the like. These openings are formed in such a manner as to have shapes that correspond to the shapes of the recesses 2 and the dummy recesses 20 that will be formed in a subsequent process and in such a manner that the distance between one of the openings and the other one of the openings is a predetermined distance.

Figure 7B:
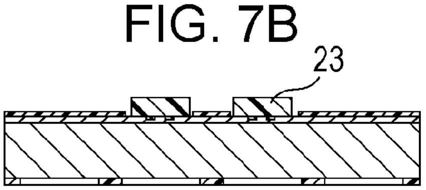

Next, as illustrated in FIG. 7B, patterns 23 of flow paths 4 for liquid are formed on the front surface side of the substrate 1. The patterns 23 are made of, for example, a metal such as aluminum or a resin such as a photosensitive resin. In particular, the patterns 23 may be made of a positive photosensitive resin. In the case where the patterns 23 are made of a positive photosensitive resin, a coating liquid that contains a positive photosensitive resin is applied onto the front surface of the substrate 1 by spin coating or the like, exposed to light by using an exposure apparatus after been applied on the front surface of the substrate 1, and finally, developed, so that the patterns 23 are formed.

Figure 7C:
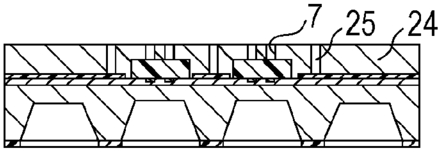

Next, as illustrated in FIG. 7C, a flow-path-forming member 24 is formed in such a manner as to cover the patterns 23. The flow-path-forming member 24 is made of a resin or the like. In particular, the flow-path-forming member 24 may be made of a negative photosensitive resin. After that, discharge ports 7 and portions 25 on each of which a cutting operation is to be performed are formed in the flow-path-forming member 24 by photolithography or the like. Here, since the discharge ports 7 are formed in the flow-path-forming member 24, the flow-path-forming member 24 serves as the discharge-port-forming member 6.

Figure 7D:
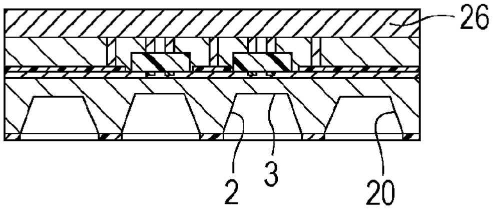

Next, as illustrated in FIG. 7D, a protective film 26 is formed in such a manner as to cover the discharge-port-forming member 6 (the flow-path-forming member 24). The protective film 26 protects the discharge-port-forming member 6 from an etching liquid that is used when the recesses 2 are formed. After the protective film 26 has been formed, the recesses 2 and the dummy recesses 20 are formed from the rear surface side of the substrate 1. The recesses 2 and the dummy recesses 20 are formed by using the openings of the etching mask layer 22 and by performing wet etching using, for example, TMAH or the like at 80 degrees for about 10 hours. Such a wet etching may be anisotropic etching, and the recesses 2 and the dummy recesses 20 each of which has a side surface that is a (111) plane and a bottom portion 3 having a surface which is a (100) plane can be efficiently formed by anisotropic etching.

Figure 7E:
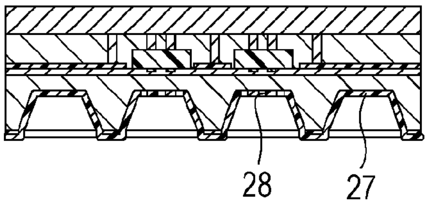

Next, as illustrated in FIG. 7E, an etching mask 27 is formed in the recesses 2 and the dummy recesses 20. The etching mask 27 is formed by, for example, applying a resin material or the like onto the recesses 2 and the dummy recesses 20 by, for example, spraying the resin material or the like thereon. Such a material that has been applied is exposed to light by using a projection exposure apparatus or the like and is developed. In this manner, openings 28 are formed in the etching mask 27. The openings 28 serve as opening portions of the etching mask 27 that are used when holes 8, which will be formed later, are formed, and the shapes of the openings 28 correspond to the shapes of the holes 8. Thus, the openings 28 need to be formed in the bottom portions 3 of the recesses 2. On the other hand, the holes 8 need not be formed in the bottom portions 3 of the dummy recesses 20. Therefore, the openings 28 need not be formed in the bottom portions 3 of the dummy recesses 20 from the standpoint of manufacturing and the like.

Figure 7F:
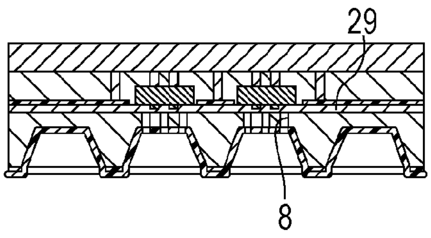

Next, as illustrated in FIG. 7F, a process of forming the holes 8 that serve as individual flow paths in the bottom portions 3 of the recesses 2 is performed. The holes 8 are formed by performing a reactive ion etching operation. Reactive ion etching is an etching operation that is performed by using positive ions that are accelerated, and an apparatus that is used in such a reactive ion etching operation has a plasma source that produces ions and a reaction chamber that is used for performing an etching operation, the plasma source and the reaction chamber being separated from each other. For example, in the case where an inductively coupled plasma (ICP) dry etching apparatus capable of emitting high-density ions is used as an ion source, the holes 8 that are perpendicular to the substrate 1 are formed in the substrate 1 by alternately performing a coating operation and an etching operation (i.e., a deposition/etching process). In the deposition/etching process, for example, $SF_6$ gas can be used as an etching gas, and, for example, $C_4F_8$ gas can be used as a coating gas. Although the holes 8 may be formed by reactive ion etching that is performed by using an ICP plasma apparatus, a dry etching apparatus that includes a plasma source employing a different system may be used. For example, an apparatus that includes an electron cyclotron resonance (ECR) ion source can be used.

Reactive ion etching may be performed under conditions of a flow rate of $SF_6$ gas of 50 sccm or more and 1,000 sccm or less, a flow rate of $C_4F_8$ gas of 50 sccm or more and 1,000 sccm or less, and a gas pressure of 0.1 Pa or more and 50.0 Pa or less. An etching operation can be performed with higher verticality by controlling these conditions within the above ranges. The gas pressure is preferably 0.5 Pa or more. In addition, the gas pressure is preferably 5.0 Pa or less.

An etching stop layer 29 for reactive ion etching is formed on the front surface side of the substrate 1. A silicon oxide film (SiO), a metal film such as Al, a nitride film (SiN), which is an inorganic film, or the like can be used as the etching stop layer 29. The etching stop layer 29 may be formed at any stage of the above-described processes and may be formed when the substrate 1 is prepared.

Figure 7G:
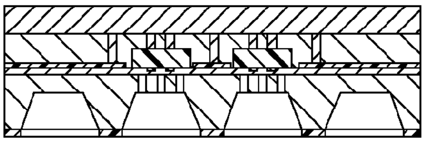
Figure 7H:
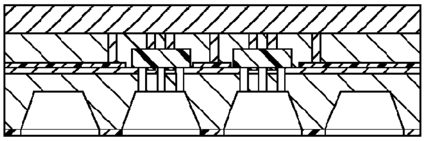

Next, as illustrated in FIG. 7G, the etching mask 27 is removed by using a peeling solution or the like. A typical peeling solution for resin may be used as the peeling solution. For example, in the case where the etching stop layer 29 is a metal film such as Al or an inorganic film such as SiN, a mixed solution of phosphoric acid, nitric acid, and acetic acid may be used. After that, as illustrated in FIG. 7H, the etching stop layer 29 is removed by using buffered hydrogen fluoride or the like in such a manner as to cause the holes 8 to reach the patterns 23.

Figure 7I:
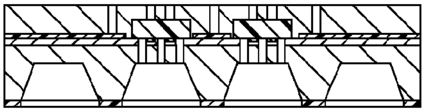
Figure 7J:
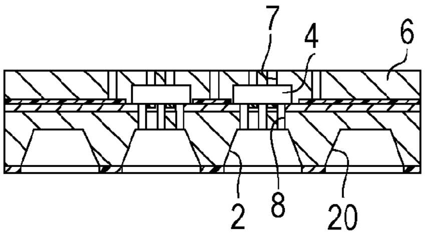

Next, as illustrated in FIG. 7I, the protective film 26 is removed, and as illustrated in FIG. 7J, the patterns 23 are removed. In this manner, the substrate 1 in which the recesses 2, which serve as common flow paths, and the holes 8, which serve as individual flow paths, are formed is formed, and the discharge-port-forming member 6 in which the flow paths 4 for liquid and the discharge ports 7 are formed is formed on the front surface side of the substrate 1.

Figure 7K:
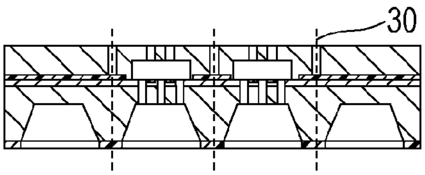

Finally, as illustrated in FIG. 7K, the substrate 1 is cut along dashed lines 30 by a dicing blade or the like, so that one liquid discharge head is manufactured. In other words, the substrate 1 is cut at positions between the recesses 2, each of which includes the bottom portion 3 in which the holes 8 are formed and each of which is formed in the process of forming the holes 8 in the bottom portions 3 of the recesses 2, and the dummy recesses 20. Each of the substrates 1 in which the dummy recesses 20 are formed will not be used as a substrate of a liquid discharge head, and each of the substrates 1 in which the recesses 2, each of which includes the bottom portion 3 in which the holes 8 are formed, are formed is used as a substrate of a liquid discharge head.

Figure 8A:
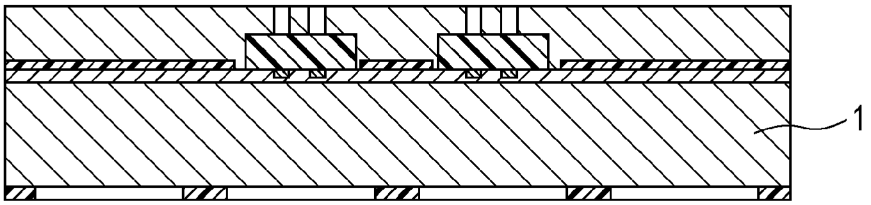
FIGS. 8A and 8B are diagrams illustrating an example of a method of manufacturing a liquid discharge head.
Figure 8B:
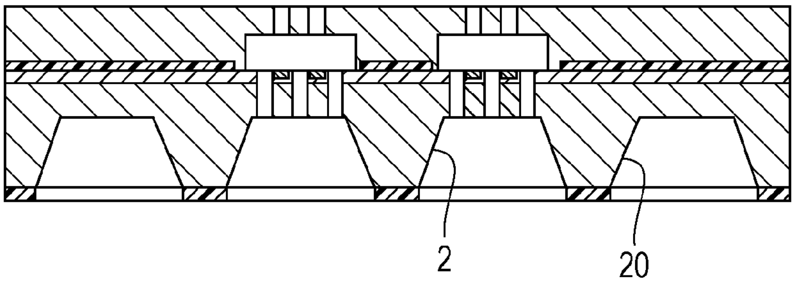

In the above example, although the portions 25 on each of which a cutting operation is to be performed are formed in the process illustrated in FIG. 7C, the portions 25 on each of which a cutting operation is to be performed need not be formed. In other words, the state illustrated in FIG. 7C becomes the state illustrated in FIG. 8A. In addition, the substrate 1 is cut as illustrated in FIG. 8B in such a manner that the recesses 2 and the dummy recesses 20 are still present on the same substrate 1 after a cutting operation has been performed. As a result, the recesses 2 and the dummy recesses 20 are formed in the substrate 1 of one liquid discharge head. In the case where a large area is present in an end portion of a chip because of an area for wiring lines or the like, the influence of a tilt can be efficiently suppressed by forming the dummy recesses 20 on the side of the substrate 1.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-090807, filed Apr. 23, 2013, which is hereby incorporated by reference herein in its entirety.

What is claimed is:

1. A method for preventing tilt while forming holes in a substrate comprising:

forming a hole in a bottom portion of each of a plurality of recesses that are formed in a substrate to be arranged in an array direction and spaced apart from each other by a predetermined distance by performing reactive ion etching on the bottom portion of each of the plurality of recesses, and controlling a width of a sheath formed along a surface of the substrate while performing the reactive ion etching by forming at least one dummy recess proximate one of the plurality of recesses, wherein the at least one dummy recess is formed on at least one side of the array direction in which the plurality of recesses are formed.

2. The method of processing a substrate according to claim 1, wherein, the dummy recess is formed outside a recess that is located at an end among the plurality of recesses, each of which includes the bottom portion in which the hole is formed and which are arranged in the array direction.

3. The method of processing a substrate according to claim 1, wherein the dummy recess is formed in such a manner as to surround the plurality of recesses, each of which includes the bottom portion in which the hole is formed and which are arranged in the array direction.

4. The method of processing a substrate according to claim 1, wherein the substrate is cut at a position between the plurality of recesses, each of which includes the bottom portion in which the hole is formed and which are formed in the process of forming the hole in the bottom portion of each of the plurality of recesses, and the dummy recess.

5. The method of processing a substrate according to claim 1, wherein the substrate is a silicon substrate made of silicon.

6. The method of processing a substrate according to claim 1, wherein the plurality of recesses are formed by wet etching.

7. The method of processing a substrate according to claim 1, wherein the holes are holes that extend through the substrate from the bottom portions of the plurality of recesses.

8. The method of processing a substrate according to claim 1, wherein a bottom portion of the dummy recess does not have a hole formed in the bottom portion.

9. A method of manufacturing a liquid discharge head comprising:

forming a hole in a bottom portion of each of a plurality of recesses that are formed in a substrate in such a manner as to be arranged in an array direction and spaced apart from each other by a predetermined distance by performing reactive ion etching on the bottom portion of each of the plurality of recesses; and cutting the substrate at a position between the plurality of recesses, each of which includes the bottom portion in which the hole is formed and which are formed in the process of forming the hole in the bottom portion of each of the plurality of recesses, and a dummy recess, wherein the process of forming the hole in the bottom portion of each of the plurality of recesses is a process of preparing a substrate in which the dummy recess that serves as a dummy is formed on at least one side of the array direction in which the plurality of recesses, each of which includes the bottom portion in which the hole is formed, are arranged in such a manner that a recess is formed on both sides of a recess so that the plurality of recesses are spaced apart from one another by the predetermined distance in the array direction in which the plurality of recesses, each of which includes the bottom portion in which the hole is formed, are arranged and performing reactive ion etching on the bottom portion of each of the plurality of recesses of the substrate, which is prepared, and wherein a portion of the substrate in which the dummy recess is formed is not used as a substrate of a liquid discharge head, and a portion of the substrate in which the plurality of recesses, each of which includes the bottom portion in which the hole is formed, are formed is used as a substrate of a liquid discharge head.

10. The method of manufacturing a liquid discharge head according to claim 9, wherein, the dummy recess is formed outside a recess that is located at an end among the plurality of recesses, each of which includes the bottom portion in which the hole is formed and which are arranged in the array direction.

11. The method of manufacturing a liquid discharge head according to claim 9, wherein the dummy recess is formed in such a manner as to surround the plurality of recesses, each of which includes the bottom portion in which the hole is formed and which are arranged in the array direction.

12. The method of manufacturing a liquid discharge head according to claim 9, wherein the substrate is a silicon substrate made of silicon.

13. The method of manufacturing a liquid discharge head according to claim 9, wherein the plurality of recesses are formed by wet etching.

14. The method of manufacturing a liquid discharge head according to claim 9, wherein the holes are holes that extend through the substrate from the bottom portions of the plurality of recesses.

15. The method of manufacturing a liquid discharge head according to claim 9, wherein a bottom portion of the dummy recess does not have a hole formed in the bottom portion.

16. A method of processing a substrate comprising:

forming a hole in a bottom portion of each of a plurality of recesses that are formed in a substrate to be arranged in an array direction and spaced apart from each other by a predetermined distance by performing reactive ion etching on the bottom portion of each of the plurality of recesses, wherein the forming the hole in the bottom portion of each of the plurality of recesses is a process of preparing a substrate in which a dummy recess that serves as a dummy is formed on at least one side of the array direction in which the plurality of recesses, each of which includes the bottom portion in which the hole is formed, are arranged in such a manner that a recess is formed on both sides of a recess so that the plurality of recesses are spaced apart from one another by the predetermined distance in the array direction in which the plurality of recesses, each of which includes the bottom portion in which the hole is formed, are arranged and performing reactive ion etching on the bottom portion of each of the plurality of recesses of the substrate, which is prepared, wherein the dummy recess is formed in such a manner as to surround the plurality of recesses, each of which includes the bottom portion in which the hole is formed and which are arranged in the array direction.

17. A method of processing a substrate comprising:

forming a hole in a bottom portion of each of a plurality of recesses that are formed in a substrate to be arranged in an array direction and spaced apart from each other by a predetermined distance by performing reactive ion etching on the bottom portion of each of the plurality of recesses, wherein the forming the hole in the bottom portion of each of the plurality of recesses is a process of preparing a substrate in which a dummy recess that serves as a dummy is formed on at least one side of the array direction in which the plurality of recesses, each of which includes the bottom portion in which the hole is formed, are arranged in such a manner that a recess is formed on both sides of a recess so that the plurality of recesses are spaced apart from one another by the predetermined distance in the array direction in which the plurality of recesses, each of which includes the bottom portion in which the hole is formed, are arranged and performing reactive ion etching on the bottom portion of each of the plurality of recesses of the substrate, which is prepared, wherein the substrate is cut at a position between the plurality of recesses, each of which includes the bottom portion in which the hole is formed and which are formed in the process of forming the hole in the bottom portion of each of the plurality of recesses, and the dummy recess.

* * * * *